United States Patent
Jeong et al.

(10) Patent No.: US 7,638,365 B2
(45) Date of Patent: Dec. 29, 2009

(54) STACKED CHIP PACKAGE AND METHOD FOR FORMING THE SAME

(75) Inventors: Se-Young Jeong, Chungcheongnam-do (KR); Nam-Seog Kim, Gyeonggi-do (KR); Cha-Jea Jo, Gyeonggi-do (KR); Jong-Ho Lee, Chungcheongnam-do (KR); Myeong-Soon Park, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 359 days.

(21) Appl. No.: 11/623,279

(22) Filed: Jan. 15, 2007

(65) Prior Publication Data

US 2008/0096315 A1    Apr. 24, 2008

(30) Foreign Application Priority Data

Oct. 23, 2006   (KR)   .................... 10-2006-0103043

(51) Int. Cl.
*H01L 21/50* (2006.01)
*H01L 21/48* (2006.01)
*H01L 21/44* (2006.01)
*H01L 23/52* (2006.01)
*H01L 23/48* (2006.01)
*H01L 29/40* (2006.01)
*H01L 27/146* (2006.01)
*H01L 27/148* (2006.01)
*H01L 23/02* (2006.01)

(52) U.S. Cl. .................. 438/109; 257/777; 257/686; 257/E27.137; 257/E27.144; 257/E27.161

(58) Field of Classification Search .............. 438/109; 257/777, 686, E27.137, E27.144, E27.161
See application file for complete search history.

(56) References Cited

U.S. PATENT DOCUMENTS 6,147,401 A * 11/2000 Solberg ................... 257/723
6,559,528 B2    5/2003 Watase et al.
6,621,172 B2 *  9/2003 Nakayama et al. ........ 257/787

(Continued)

FOREIGN PATENT DOCUMENTS

JP        2001-230369         8/2001

(Continued)

OTHER PUBLICATIONS

English language abstract of Japanese Publication No. 2001-230369.

(Continued)

*Primary Examiner*—Luan C Thai
(74) *Attorney, Agent, or Firm*—Myers Bigel Sibley & Sajovec, PA

(57) ABSTRACT

Provided is a stacked chip package and a method for forming the same. A spacer is formed on a side of an upper chip. A conductive line is formed on the spacer to electrically connect upper and lower chips. The reliability of the stacked chip package is improved because wire bonding is not used to electrically connect the upper and lower chips. Further, the overall size of the stacked chip package can be reduced as the height of bonding wire loops does not contribute to the overall stacked chip package height.

29 Claims, 5 Drawing Sheets

U.S. PATENT DOCUMENTS

| | | |
|---|---|---|
| 6,633,081 B2 | 10/2003 | Sahara et al. |
| 2003/0006493 A1* | 1/2003 | Shimoishizaka et al. .... 257/686 |
| 2004/0155326 A1 | 8/2004 | Kanbayashi |

FOREIGN PATENT DOCUMENTS

| | | |
|---|---|---|
| JP | 2002-289766 | 10/2002 |
| JP | 2002-353402 | 12/2002 |
| JP | 2004-63569 | 2/2004 |
| KR | 10-2001-0083204 | 8/2001 |
| KR | 10-2002-0028474 | 4/2002 |
| KR | 2003-0059459 | 7/2003 |
| KR | 10-2006-0072985 | 6/2006 |
| KR | 10-2006-0075432 | 7/2006 |

OTHER PUBLICATIONS

English language abstract of Korean Publication No. 10-2001-0083204.

English language abstract of Korean Publication No. 10-2002-0028474.

English language abstract of Japanese Publication No. 2004-63569.

* cited by examiner

STACKED CHIP PACKAGE AND METHOD FOR FORMING THE SAME

CROSS-REFERENCE TO RELATED APPLICATIONS

This U.S. non-provisional patent application claims priority under 35 U.S.C. § 119 to Korean Patent Application No. 2006-103043, filed on Oct. 23, 2006, the contents of which are herein incorporated by reference in their entirety.

BACKGROUND

1. Technical Field

The invention disclosed herein relates to a semiconductor package, and more particularly, to a stacked chip package having a plurality of vertically stacked semiconductor chips, and a method of manufacturing the same.

2. Description of the Related Art

Semiconductor devices and their associated packaging techniques have been jointly developed in order to achieve high density and high speed in a thin, compact footprint. In a semiconductor package structure, the through hole mounting method has been replaced by a surface mounting method in order to drastically increase the mounting density of package structures for a given circuit substrate. A chip scale package (CSP) has been developed and continuously studied by various companies. The CSP maintains bare chip characteristics in a package state, can be easily handled, and has a considerably reduced package size. Additionally, a three dimensional stacking technique, which stacks a plurality of unit semiconductor chips or unit semiconductor chip packages to increase capacity and mounting density, has recently generated interest, and is actively being researched by the semiconductor manufacturing industry.

FIG. 1 is a sectional view of a conventional stacked chip package structure. Referring to FIG. 1, a semiconductor chip 5 is attached on another semiconductor chip 3, which is mounted on a substrate 1 having a circuit pattern, using an adhesive such as medium 6. Chip pads 3a and 5a of the semiconductor chips 3 and 5 and electrode pads 7 of the substrate 1 are electrically connected by a metal wire 4. The top of the substrate 1 including the semiconductor chips 3 and 5, and the metal wire 4 form a package body which may be covered using an epoxy molding resin (not shown). The epoxy molding resin protects the surfaces of the semiconductor chips 3 and 5 as well as the metal wires 4. The bottom of the substrate 1 includes a solder ball 9 which may be connected to an external circuit, such as would be found on a printed circuit board (PCB).

In a conventional stacked chip package having the above structure, the semiconductor chips 3 and 5 and the substrate 1 have to be electrically connected to each other through the metal wires 4, typically by a wire bonding process. Specifically, the chip pads 3a and 5a and the electrode pads 7 in the substrate 1 need to be electrically connected, or wire bonded. It may take several processing steps to make all of the wire bonding connections. Therefore, it takes a long processing time to make the conventional stacked chip package. Moreover, it is difficult to reduce the packaging area because a pre-defined wire loop shape needs to be obtained for ensuring reliable processing and operational performance. If the loop in metal wire 4 is not formed in the correct shape and correct height, wire 4 may be disconnected from the chip pads 3a and 5a during subsequent processing or during operation. Since the loops in metal wires 4 extend significantly above the top surface of the semiconductor chip 5, the overall height of the semiconductor package has to be increased so that the epoxy molding resin can adequately protect the metal wires 4. Especially, when the number of stacked chips increases, it is very difficult to reduce the package size and a short between the bonding wires of the several stacked packages can occur.

Further, several problems associated with wire bonding such as bending and protruding phenomena, incomplete filling of the epoxy molding resin, and an unstable electrical connection may occur in stacked chip packages using wire bonding, leading to deterioration of the reliability of the package. Consequently, a stacked semiconductor package that does not include bonding wires is desired.

SUMMARY

Exemplary embodiments of the invention provide a stacked semiconductor package in a new structure including spacers with patterned conductive lines disposed on stacked semiconductor chips. Exemplary methods for forming the stacked semiconductor package with the new structure are also provided.

BRIEF DESCRIPTION OF THE FIGURES

The accompanying figures are included to provide a further understanding of the embodiments of the invention, and are incorporated, in and constitute a part of, this specification. The drawings illustrate exemplary embodiments of the invention and, together with the description, serve to explain principles of the invention. In the figures.

DETAILED DESCRIPTION

Figure 1:
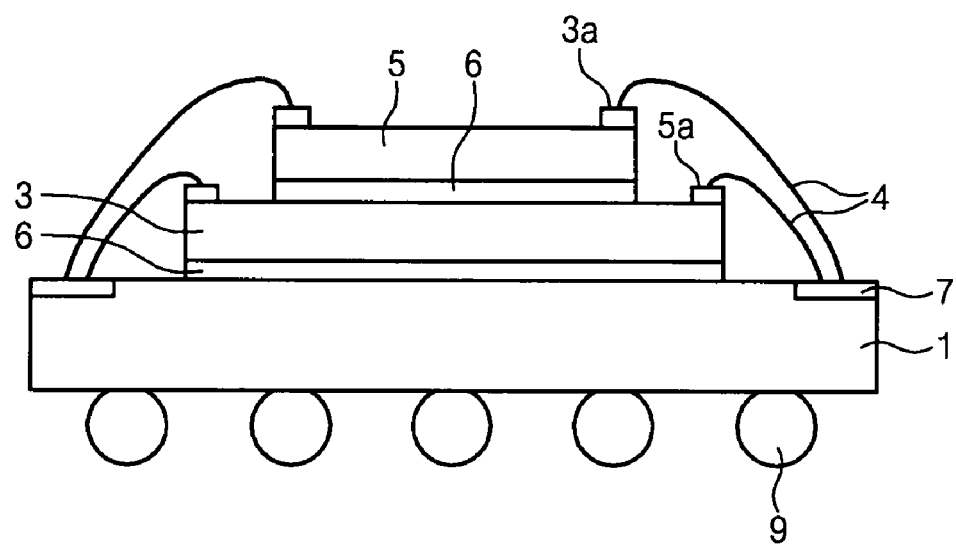
FIG. 1 is a sectional view of a conventional stacked chip package structure.

Exemplary embodiments of the invention will be described below in more detail with reference to the accompanying drawings. The exemplary embodiments of the invention may, however, be embodied in different forms and should not be constructed as limited to the embodiments set forth herein. Rather, these embodiments are provided so that this disclosure will be thorough and complete, and will fully convey the scope of the invention to those skilled in the art. Accordingly, well-known methods, device structures, and techniques will not be described in detail to avoid ambiguous interpretation of the invention. Like reference numerals refer to like elements throughout.

Additionally, the embodiment in the detailed description will be described with sectional views of the ideal embodiments. Accordingly, the illustrated embodiments may vary from the actual manufactured devices due to manufacturing techniques and/or allowable errors. Therefore, the embodiments of the invention are not limited to the specific forms illustrated, and include certain forms that are created according to manufacturing tolerances. Certain areas in the drawings include schematic properties, and certain forms in areas of the drawings are used to illustrate a specific form in a semiconductor package region. However, this does not limit the scope of the invention.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Embodiments of the invention are related to a stacked semiconductor package, and more particularly to a semiconductor package including at least two semiconductor chips. A stacked semiconductor package in which only two semiconductor chips are stacked will be described below in order to make the embodiments more clear. However, it should be understood that stacked semiconductor packages including more than two semiconductor chips fall within the spirit and scope of the invention.

Figure 2A:
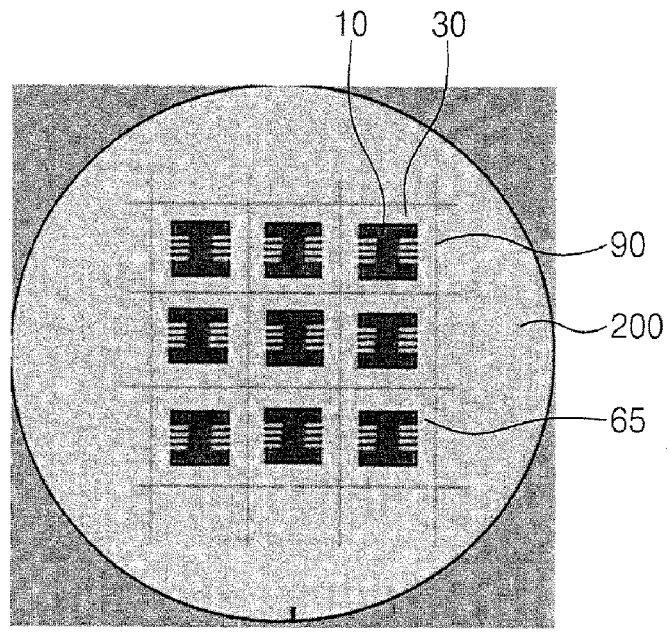
FIG. 2A is a plan view of a stacked chip package structure according to an embodiment of the invention.

FIG. 2A is a plan view of a stacked chip package structure according to an embodiment of the invention.

As illustrated in FIG. 2A, a semiconductor wafer such as a silicon wafer substrate 200 includes predetermined integrated circuits formed by a wafer manufacturing process. Circuits integrated into the wafer substrate 200 constitute a plurality of integrated circuit chips 10. A scribe line 90, where circuits are not formed, is disposed between neighboring integrated circuit chips 10. Since description of the integrated circuit constituting the integrated circuit chip 10 of the wafer substrate 200 is unnecessary for understanding the invention, it will be omitted in the detailed description and the drawings for simplicity.

In this embodiment, the integrated circuit chip 10 formed on the wafer substrate 200 may be called a first semiconductor chip, and another integrated circuit chip 30 disposed on the first semiconductor chip 10 may be called a second semiconductor chip. However, the first and second semiconductor chips are relative terms for describing the embodiment of the invention more clearly, and the invention is not limited to these terms. In a stacked package having two stacked semiconductor chips, for example, any one of semiconductor chips may be a first semiconductor chip and the other may be a second semiconductor chip.

The second semiconductor chip 30 is a chip that is cut along a scribe line, and is attached to the first semiconductor chip 10 using an adhesive medium. According to one embodiment of the invention, a bonding pad of the first semiconductor chip 10 and a boding pad of the second semiconductor chip 30 are connected to each other by a conductive line such as a metal line 65.

Figure 2B:
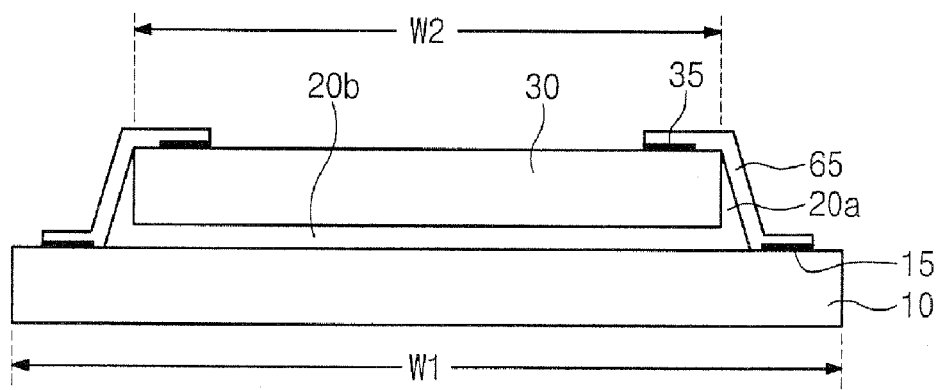
FIG. 2B is a sectional view of a stacked chip package structure according to an embodiment of the invention.

An electrical connection between the first semiconductor chip 10 and the second semiconductor chip 30 will be described in more detail with reference to FIG. 2B. FIG. 2B is a sectional view of a portion of FIG. 2A.

Referring to FIG. 2B, the second semiconductor chip 30 is attached to the first semiconductor chip 10 using an adhesive 20b. Also, the second semiconductor chip 30 may be attached to the first semiconductor chip 10 so as to expose a portion of the first semiconductor chip 10. A bonding pad 15 of the first semiconductor chip 10 may be disposed on the exposed portion of the first semiconductor chip 10. A spacer 20a is disposed on a side of the second semiconductor chip 30. A bonding pad 15 of the first semiconductor chip 10 may be disposed adjacent to the bottom of the spacer 20a. A boding pad 35 of the second semiconductor chip 30 may be disposed adjacent to the top of the spacer 20a. The bonding pad 15 of the first semiconductor chip 10 and the boding pad 35 of the second semiconductor chip 30 are electrically connected to each other by the metal line 65 that is formed on the spacer 20a.

The metal line 65 may be formed by including a photolithography process for patterning the metal line after forming a metal material layer. Specific techniques for forming the metal line 165 will be described below. According to the embodiment of the invention, since a spacer 20a is formed on a side of the second semiconductor chip 30, a conductive material for a conductive line such as a metal line 65 can be continuously formed along the exposed first semiconductor chip 10, spacer 20a, and second semiconductor chip 30 without being cut or broken at the edge of the second semiconductor chip 30.

When the first semiconductor chip 10 and the second semiconductor chip 30 are attached using the adhesive 20b or after the second semiconductor chip 30 is attached on the first semiconductor chip 10, the spacer 20a may be formed by performing a hardening process after forming the adhesive 20b on a side of the second semiconductor chip 30. In other words, the spacer 20a may be formed of the same material as the adhesive 20b, with the spacer 20a being subjected to a hardening process.

In the embodiment of the invention, the second semiconductor chip 30 is disposed on the first semiconductor chip 10 and the spacer 20a is disposed on a side of the second semiconductor chip 30. For this embodiment, the second semiconductor chip 30 may be disposed on the first semiconductor chip 10 so as to expose a portion of the first semiconductor chip 10. For example, the width of the second semiconductor chip 30 may be narrower than that of the first semiconductor chip 10. In this case, the second semiconductor chip 30 may be disposed on the first semiconductor chip 10 so as to expose a portion of the first semiconductor chip 10 outside the side edges of the second semiconductor chip 30. That is, the top of the semiconductor chip 30 may have an area smaller than that of the top of the first semiconductor chip 10. Portions of the first semiconductor chip 10 may be exposed around all four sides of the second semiconductor chip 30. Alternatively, portions of the first semiconductor chip 10 may be exposed only on one, two, or three sides of the second semiconductor chip 30.

In the embodiment of the invention, the first semiconductor chip 10 and the second semiconductor chip 30 may perform various or different functions. As an example, the invention may include first and second semiconductor chips 10 and 30 that are identical or are different kinds of memory devices. However, the invention is not limited to memory devices. First and second semiconductor chips 10 and 30 may be logic devices, memory devices, or any other type of integrated circuit devices, and first semiconductor chip 10 may be an entirely different type of device than second semiconductor chip 30.

FIGS. 3A through 3H are sectional views of a stacked chip package manufacturing method according to an embodiment of the invention.

Figure 3A:
FIGS. 3A through 3H are sectional views of a stacked chip package manufacturing method according to an embodiment of the invention.

Referring to FIG. 3A, a first semiconductor chip 10 is provided. The first semiconductor chip 10 may be a wafer level semiconductor chip formed on a semiconductor wafer substrate.

Figure 3B:
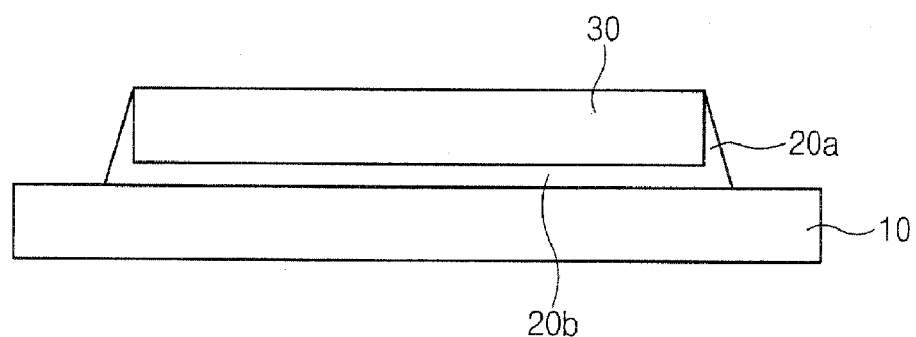

Referring to FIG. 3B, a second semiconductor chip 30 is stacked on the first semiconductor chip 10 using an adhesive 20b as an adhesive medium. At this point, a spacer 20a is formed on a side of the second semiconductor chip 30.

The spacer 20a may be formed to have a diagonally slanted surface. For example, the spacer 20a may have a diagonally slanted profile in cross-section. The height of the spacer 20a may be substantially identical to or smaller than the thickness of the second semiconductor chip 30 and/or the thickness of the adhesive 20b. For example, the height of the spacer 20a may be substantially equal to the thickness of the second semiconductor chip 30 plus the thickness of the adhesive 20b. Further, the spacer 20a may have a height and width that are substantially the same. For example, the spacer 20a may be approximately triangular shaped with the length of the bottom, in contact with the first semiconductor chip 10, and the length of the side, in contact with the second semiconductor chip 30, being substantially equal. The length of the side may be measured from a top of the first semiconductor chip 10. A conductive line such as a metal line for electrically connecting the chips can be easily formed due to the spacer 20a having a diagonally slanted surface between the stacked chips.

Figure 3C:
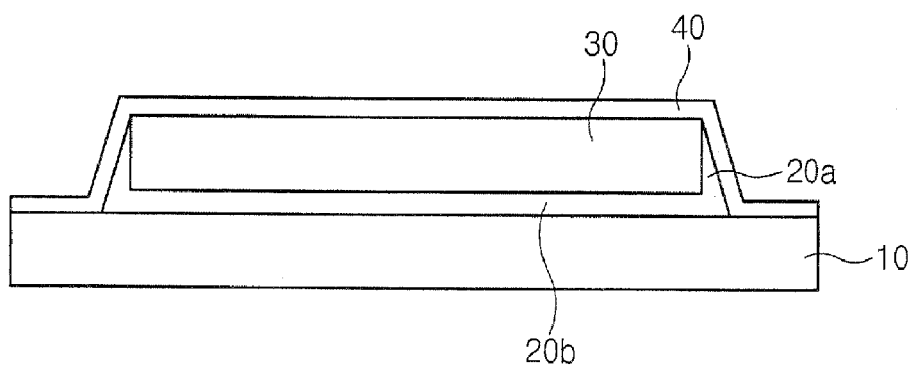

Referring to FIG. 3C, a seed metal layer 40 for the metal line may be deposited by using a sputter method. The seed metal layer 40 may include copper or nickel.

Figure 3D:
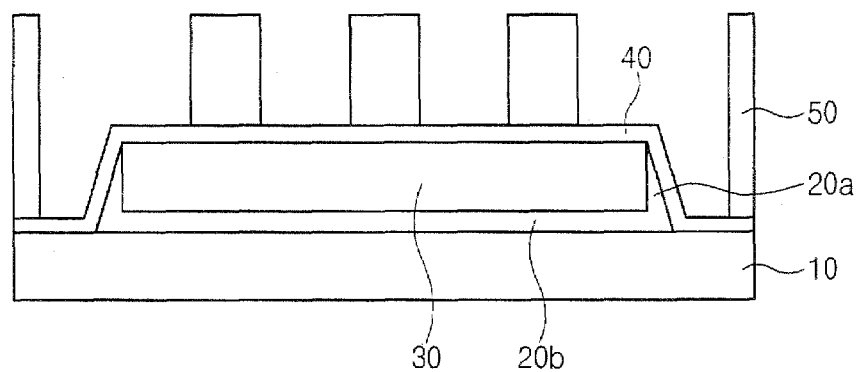

Referring to FIG. 3D, a mask pattern 50 is formed on the seed metal layer 40. The mask pattern 50 can expose the seed metal layer 40 in a region where the metal line will be formed. The mask pattern 50 may be formed by using a photoresist.

Figure 3E:
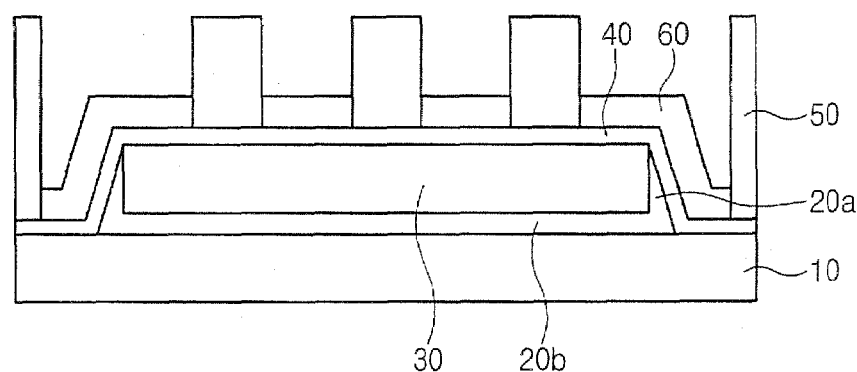

Referring to FIG. 3E, a metal layer 60 is formed on the top of the seed metal layer 40 that is not covered by the mask pattern 50. For example, the metal layer 60 may be formed by using electroplating.

Figure 3F:
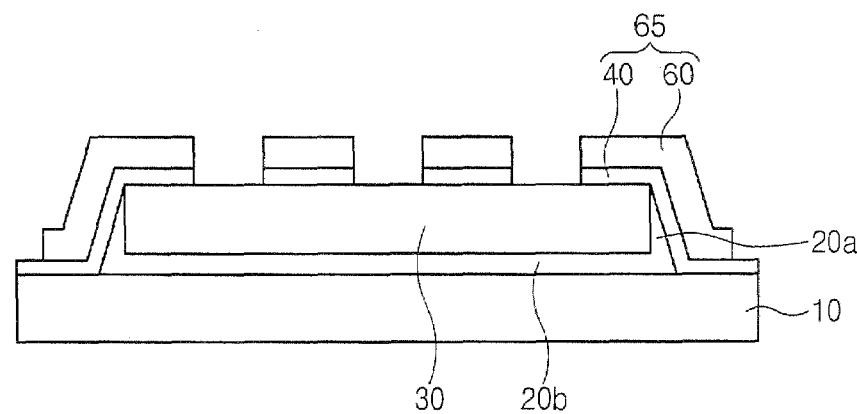

Referring to FIG. 3F, the seed metal layer 40 outside the metal layer 60 is exposed by removing the mask pattern 50. Next, the exposed seed metal layer 40 outside the metal layer 60 is removed by using the metal layer 60 as an etching mask to form a conductive line layer such as a metal line layer 65 that electrically connects bonding pads of the chips.

Figure 3G:
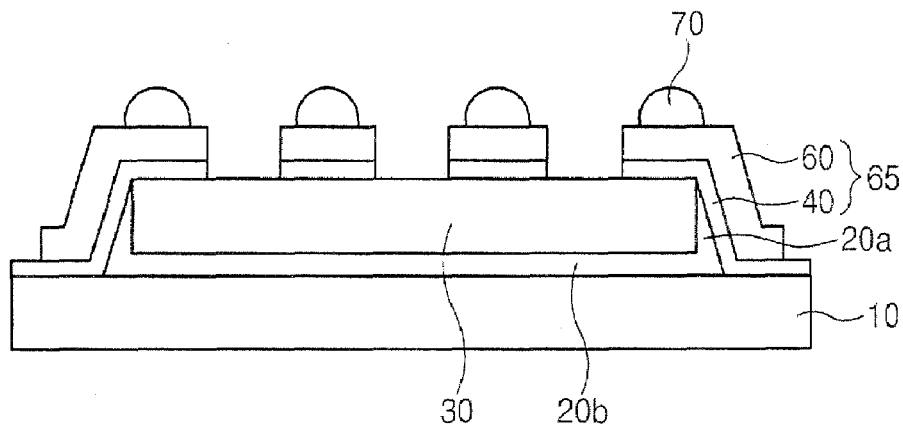

As illustrated in FIG. 3G, a conductive bump such as a solder bump 70 is formed on the metal layer 65. Since the bump pad where the solder bump 70 is formed is connected to the chip pad through the metal line layer 65, the position of the bump pad may be disposed different from the position of the chip pad. That is, the positions of the chip pads can be rearranged. A wafer is cut along a scribe line to separate the stacked chips.

Figure 3H:
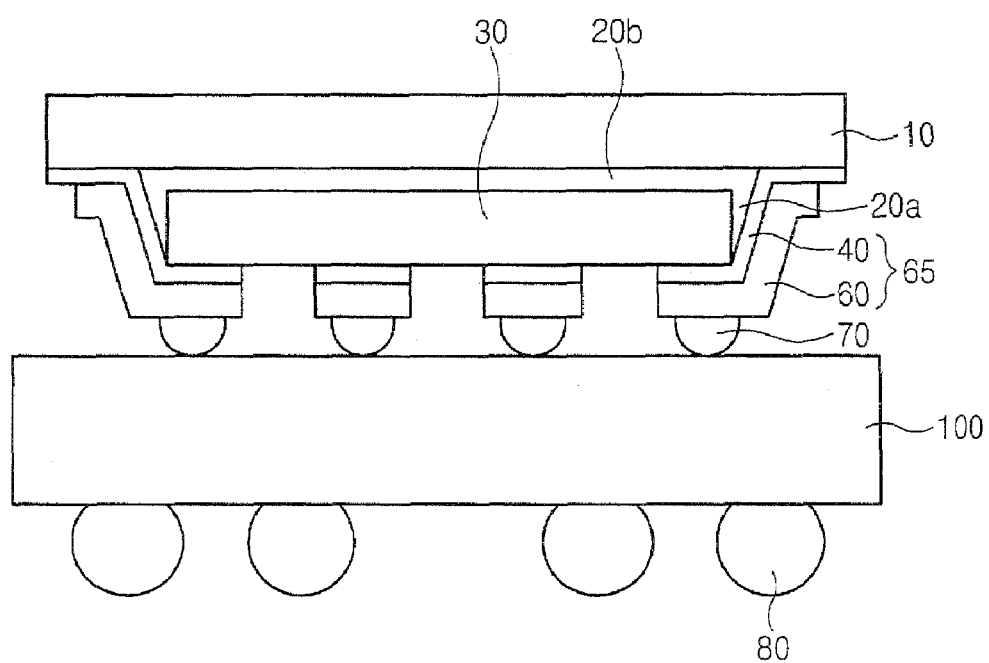

As illustrated in FIG. 3H, a flip chip is assembled on a print circuit board (PCB) 100 where circuits are formed to complete a multi chip package.

In the above method, electroplating can be performed before the forming of the mask pattern. That is, after the forming of the seed metal layer 40, a mask pattern is formed after the forming of the metal layer 60 through electroplating. Next, the metal line is formed by removing the metal layer 60 and the seed metal layer 40 that are not covered by the mask pattern.

In the above method, the seed metal layer 40 may be omitted. For example, after the forming of the metal layer 60, without forming the seed metal layer 40, the metal line may be formed by patterning the metal layer 60.

The adhesive layer 20b and the spacer 20a can be formed by using different processes. For example, a second semiconductor chip is attached to a first semiconductor chip by using the adhesive layer 20b. Next, the spacer 20a is formed on a side of the second semiconductor chip. Alternatively, the adhesive layer 20b and the spacer 20a may be formed at the same time, using the same material, as described previously.

As described above, embodiments of the invention are free of wire bonding. Accordingly, problems associated with wire bonding such as bending and protruding phenomena, incomplete filling of the epoxy molding resin, and an unstable electrical connection may not occur. By omitting the bonding wires, the reliability of the stacked semiconductor package can be improved. Further, the overall size of the stacked semiconductor package can be reduced because the extra height associated with bonding wire loops is not required.

In some embodiments of the invention, a method for forming a semiconductor package includes stacking a second semiconductor chip on a first semiconductor chip. A spacer is formed on a side of the second semiconductor chip. A conductive line such as a metal line is formed on the spacer. The metal line electrically connects the first semiconductor chip and the second semiconductor chip.

In other embodiments of the invention, a method for forming a semiconductor package includes forming a first semiconductor chip on a semiconductor wafer. A second semiconductor chip is attached on the first semiconductor chip. A metal layer is deposited on the wafer and the semiconductor chips. A conductive line such as a metal line is formed to connect the first and second semiconductor chips electrically by patterning the metal layer.

In still other embodiments of the invention, a stacked semiconductor package includes a first semiconductor chip; a second semiconductor chip stacked on the first semiconductor chip. A spacer is formed on a side of the second semiconductor chip. A conductive line such as a metal line is formed on the spacer and electrically connects the first semiconductor chip and the second semiconductor chip.

The above-disclosed subject matter is to be considered illustrative, and not restrictive, and the appended claims are intended to cover all such modifications, enhancements, and other embodiments, which fall within the spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A method for forming a semiconductor package, the method comprising:
   stacking a second semiconductor chip on a first semiconductor chip using an adhesive;
   forming a spacer on sides of the second semiconductor clip, wherein a height of the spacer is substantially equal to or less than a combined thickness of the second semiconductor chip and the adhesive; and
   forming a conductive line directly on the spacer, the conductive line electrically connecting the first semiconductor chip and the second semiconductor chip.

2. The method of claim 1, wherein forming the spacer comprises using the adhesive.

3. The method of claim 1, wherein the forming of the conductive line comprises:
   forming a conductive layer; and
   patterning the conductive layer.

4. The method of claim 3, wherein the forming of the conductive layer comprises:
   forming a seed metal layer; and
   performing an electroplating process to form a metal layer on the seed metal layer.

5. The method of claim 4, further comprising:
   forming a mask pattern on the seed metal layer before the performing of the electroplating process; and
   removing the mask pattern after the performing of the electroplating process, wherein the metal layer is selectively formed on the seed metal layer not covered by the mask pattern, and the patterning of the conductive layer includes removing the seed metal layer below the mask pattern.

6. The method of claim 1, wherein the conductive line comprises copper.

7. The method of claim 6, wherein the copper conductive line is formed by performing an electroplating process.

8. The method of claim 1, further comprising forming a conductive bump on the conductive line.

9. A method for forming a semiconductor package, the method comprising:
    forming a first semiconductor chip on a semiconductor wafer;
    attaching a second semiconductor chip on the first semiconductor chip, using an adhesive;
    forming a spacer on sides of the second semiconductor chip, wherein a height of the spacer is substantially equal to or less than a combined thickness of the second semiconductor chip and the adhesive;
    depositing a metal layer on the wafer, on the first and second semiconductor chips, and directly on the spacer; and
    patterning the metal layer to form a metal line electrically connecting the first and second semiconductor chips.

10. The method of claim 9, wherein the spacer has substantially the same height and width.

11. The method of claim 9, wherein forming the spacer comprises a hardening process of the adhesive.

12. The method of claim 9, further comprising forming a conductive bump on the conductive line.

13. The method of claim 12, further comprising attaching a printed circuit board to the conductive bump such that the conductive bump electrically connects the conductive line to circuits formed on the printed circuit board.

14. The method of claim 9, wherein the metal layer comprises copper.

15. The method of claim 14, wherein depositing the metal layer comprises an electroplating process.

16. The method of claim 9, further comprising forming a seed layer on the wafer and the first and second semiconductor chips before depositing the metal layer.

17. The method of claim 16, wherein forming the seed layer comprises a sputter process.

18. The method of claim 16, wherein patterning the metal layer comprises:
    forming a mask pattern on the metal layer thereby exposing portions of the metal layer;
    removing the exposed portions of the metal layer thereby exposing portions of the seed layer; and
    removing the exposed portions of the seed layer.

19. The method of claim 9, wherein depositing the metal layer comprises:
    forming a seed layer on the wafer and the first and second semiconductor chips;
    forming a mask pattern on the seed layer, thereby exposing portions of the seed layer; and
    depositing the metal layer on exposed portions of the seed layer.

20. The method of claim 19, wherein patterning the metal layer comprises:
    removing the mask pattern, thereby exposing portions of the seed layer; and
    removing the exposed portions of the seed layer.

21. A stacked semiconductor package comprises:
    a first semiconductor chip;
    a second semiconductor chip stacked on the first semiconductor chip using an adhesive;
    a spacer disposed on sides of the second semiconductor chip, wherein a height of the spacer is substantially equal to or less than a combined thickness of the second semiconductor chip and the adhesive; and
    a conductive line disposed directly on the spacer and electrically connecting the first semiconductor chip and the second semiconductor chip.

22. The stacked semiconductor package of claim 21, wherein the spacer is formed of the adhesive when the second semiconductor chip is attached to the first semiconductor chip.

23. The stacked semiconductor package of claim 21, wherein the size of the second semiconductor chip is smaller than that of the first semiconductor chip.

24. The stacked semiconductor package of claim 21, wherein the spacer has substantially the same height and width.

25. The stacked semiconductor package of claim 21, wherein the conductive line comprises copper.

26. The stacked semiconductor package of claim 21, wherein the spacer has a diagonally slanted profile in cross-section.

27. The stacked semiconductor package of claim 21, further comprising:
    one or more additional semiconductor chips stacked on the second semiconductor chip;
    one or more additional spacers disposed on the sides of the additional semiconductor chips; and
    one or more additional conductive lines disposed on the additional spacers.

28. The stacked semiconductor package of claim 21, further comprising a plurality of conductive bumps disposed on the conductive line.

29. The stacked semiconductor package of claim 28, further comprising a printed circuit board, wherein the conductive bumps electrically connect the conductive line to circuits disposed on the printed circuit board.

* * * * *